United States Patent
Hsiao et al.

(10) Patent No.: US 12,506,482 B2
(45) Date of Patent: Dec. 23, 2025

(54) OSCILLATING DEVICE

(71) Applicant: TXC CORPORATION, Taipei (TW)

(72) Inventors: Tun-Jen Hsiao, Ping Cheng (TW);
Chia-Yin Chen, Ping Cheng (TW);
Wan-Lin Hsieh, Ping Cheng (TW);
Sheng-Hsiang Kao, Ping Cheng (TW)

(73) Assignee: TXC CORPORATION, Taipei (TW)

( * ) Notice: Subject to any disclaimer, the term of this patent is extended or adjusted under 35 U.S.C. 154(b) by 0 days.

(21) Appl. No.: 18/637,144

(22) Filed: Apr. 16, 2024

(65) Prior Publication Data

US 2025/0323646 A1    Oct. 16, 2025

(51) Int. Cl.
*H03L 1/02* (2006.01)
*H03B 5/04* (2006.01)
*H03L 1/04* (2006.01)

(52) U.S. Cl.
CPC ............. *H03L 1/022* (2013.01); *H03B 5/04* (2013.01); *H03L 1/04* (2013.01)

(58) Field of Classification Search
CPC ........................................................ H03L 1/022
USPC ................................................................ 331/176
See application file for complete search history.

(56) References Cited

U.S. PATENT DOCUMENTS

| | | | |
|---|---|---|---|
| 6,784,756 B2 | 8/2004 | Villella | |
| 7,764,133 B1 * | 7/2010 | Nicholls | H03L 1/04 331/44 |
| 2018/0278256 A1 * | 9/2018 | Hirose | H03L 1/022 |

FOREIGN PATENT DOCUMENTS

| | | |
|---|---|---|
| JP | 2005-165630 A | 6/2005 |
| JP | 2006-324937 A | 11/2006 |
| JP | 2008-507174 A | 3/2008 |
| JP | 2013-150253 A | 8/2013 |
| JP | 2017-123552 A | 7/2017 |
| JP | 2017-147705 A | 8/2017 |
| JP | 2017-208637 A | 11/2017 |
| JP | 2018-163621 A | 10/2018 |
| JP | 2020-137092 A | 8/2020 |
| JP | 2021-48460 A | 3/2021 |
| JP | 2021-64922 A | 4/2021 |
| JP | 2021-129138 A | 9/2021 |
| JP | 2022-138842 A | 9/2022 |
| JP | 2022-138843 A | 9/2022 |
| JP | 2023-96335 A | 7/2023 |

(Continued)

*Primary Examiner* — Joseph Chang
(74) *Attorney, Agent, or Firm* — Birch, Stewart, Kolasch & Birch, LLP (57) ABSTRACT

An oscillating device is arranged in an environment having an ambient temperature. The oscillating device includes a heater, an oscillator, and a temperature-controlled circuit. The oscillator is configured to generate a first clock signal whose frequency is temperature-dependent on the ambient temperature. The temperature-controlled circuit is directly electrically connected to the heater. The temperature-controlled circuit senses the ambient temperature to generate an input voltage that is temperature-dependent on the ambient temperature and provides the input voltage for the heater. The temperature-controlled circuit includes a MOSFET and a temperature sensing circuit. The drain of the MOSFET is directly electrically connected to the heater. The MOSFET and the heater are electrically connected between a high voltage terminal and a low voltage terminal. The temperature sensing circuit is electrically connected to the gate of the MOSFET.

8 Claims, 7 Drawing Sheets

(56) References Cited

FOREIGN PATENT DOCUMENTS

| JP | 2023-127679 A | 9/2023 |
|----|---------------|--------|
| TW | I577129 B | 4/2017 |
| WO | WO 2017/199956 A1 | 11/2017 |

* cited by examiner

OSCILLATING DEVICE

BACKGROUND OF THE INVENTION

Field of the Invention

The present invention relates to an electronic device, particularly to an oscillating device.

Description of the Related Art

Oscillating circuits play a central and increasingly important role in digital and analog electronic systems. Digital devices require precise system timing, a function provided by oscillators and similar timing sources. Telecommunication and data transmission systems, which have analog and digital components, likewise rely on oscillators for modulation, demodulation, system clocking and other functions.

A standard choice for a highly stable frequency source in such applications is a crystal-based oscillator or resonator. Although atomic frequency standards are highly accurate, such devices are undesirable in most applications in view of cost and environmental capability. While crystal oscillators are stable in comparison with non-crystal-based circuits, the crystal oscillators nevertheless exhibit a degree of variance in frequency and stability owing to the inherent frequency response to temperature changes and other environmental influences of crystals. An approach to compensate for the temperature effects on a crystal resonator is to maintain a constant temperature of the temperature sensitive section of the oscillator. Such devices, oven controlled crystal oscillators (OCXO), provide enhanced stability and frequency control. However, OCXOs require increased manufacturing considerations and hence, greater costs so as to match the stabilities associated with their atomic frequency reference counterpart. In U.S. Pat. No. 6,784,756, the oven controlled crystal oscillator monitors a parameter corresponding to a power consumption of the heater and provides a frequency compensating signal to the input of the frequency compensator in response to the monitored parameter and a derived relationship between the monitored parameter and a required frequency compensating signal for the given crystal oscillator. The monitored parameter corresponding to a power consumption of the heater is determined by the voltage measurement across a resister in series with the heater, where the varying voltage potential signifies a varying current consumption with a constant supply.

To overcome the abovementioned problems, the present invention provides an oscillating device, so as to solve the afore-mentioned problems of the prior art.

SUMMARY OF THE INVENTION

The present invention provides an oscillating device, which captures its transient state to complete temperature post-compensation without measuring power consumption.

In an embodiment of the present invention, an oscillating device is arranged in an environment having an ambient temperature. The oscillating device includes a heater, an oscillator, and a temperature-controlled circuit. The oscillator is configured to generate a first clock signal whose frequency is temperature-dependent on the ambient temperature. The temperature-controlled circuit is directly electrically connected to the heater. The temperature-controlled circuit is configured to sense the ambient temperature to generate an input voltage that is temperature-dependent on the ambient temperature and provide the input voltage for the heater. The temperature-controlled circuit includes a metal-oxide-semiconductor field-effect transistor (MOSFET) and a temperature sensing circuit. The drain of the MOSFET is directly electrically connected to the heater. The MOSFET and the heater are electrically connected between a high voltage terminal and a low voltage terminal. The temperature sensing circuit is electrically connected to the gate of the MOSFET.

In an embodiment of the present invention, the oscillating device further includes an analog-to-digital converter (ADC) and a communication interface. The ADC is electrically connected to the heater and the temperature-controlled circuit and configured to receive and convert the input voltage into a digital voltage signal. The communication interface is electrically connected to the ADC.

In an embodiment of the present invention, the oscillating device further includes an analog-to-digital converter (ADC), a processor, and a communication interface. The ADC is electrically connected to the heater and the temperature-controlled circuit and configured to receive and convert the input voltage into a digital voltage signal. The processor is electrically connected to the ADC and configured to receive the digital voltage signal. The processor is configured to convert the digital voltage signal into a frequency compensation signal based on a voltage-frequency relationship associated with the input voltage. The communication interface is electrically connected to the ADC.

In an embodiment of the present invention, the oscillating device further includes an analog-to-digital converter (ADC), a processor, and a phase-locked loop (PLL). The ADC is electrically connected to the heater and the temperature-controlled circuit and configured to receive and convert the input voltage into a digital voltage signal. The processor is electrically connected to the ADC and configured to receive the digital voltage signal. The processor is configured to convert the digital voltage signal into a frequency compensation signal based on a voltage-frequency relationship associated with the input voltage. The PLL is electrically connected to the processor and the oscillator and configured to receive the frequency compensation signal and the first clock signal. The PLL is configured to change the phase of the first clock signal based on the frequency compensation signal to generate a second clock signal.

In an embodiment of the present invention, the voltage-frequency relationship is associated with a time varying rate of the digital voltage signal.

In an embodiment of the present invention, the voltage-frequency relationship is associated with a linear combination of polynomials to the digital voltage signal.

In an embodiment of the present invention, the MOSFET is a P-channel metal-oxide-semiconductor field effect transistor (PMOSFET) and the source of the PMOSFET and the heater are respectively electrically connected to the high voltage terminal and the low voltage terminal.

In an embodiment of the present invention, the MOSFET is an N-channel metal-oxide-semiconductor field effect transistor (NMOSFET) and the source of the NMOSFET and the heater are respectively electrically connected to the low voltage terminal and the high voltage terminal.

To sum up, the oscillating device provides the input voltage for the heater to reduce the frequency variation of the first clock signal resulted from the variation of the ambient temperature and uses the input voltage as a physical quantity to capture the transient state of the oscillating device without measuring power consumption, thereby completing temperature post-compensation.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express what the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to using different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to encompass any indirect or direct connection. Accordingly, if this disclosure mentions that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

In the following description, an oscillating device will be provided, which provides an input voltage for the heater to reduce the frequency variation of a first clock signal resulted from the variation of ambient temperature and uses the input voltage as a physical quantity to capture the transient state of the oscillating device without measuring power consumption, thereby completing temperature post-compensation.

Figure 1:
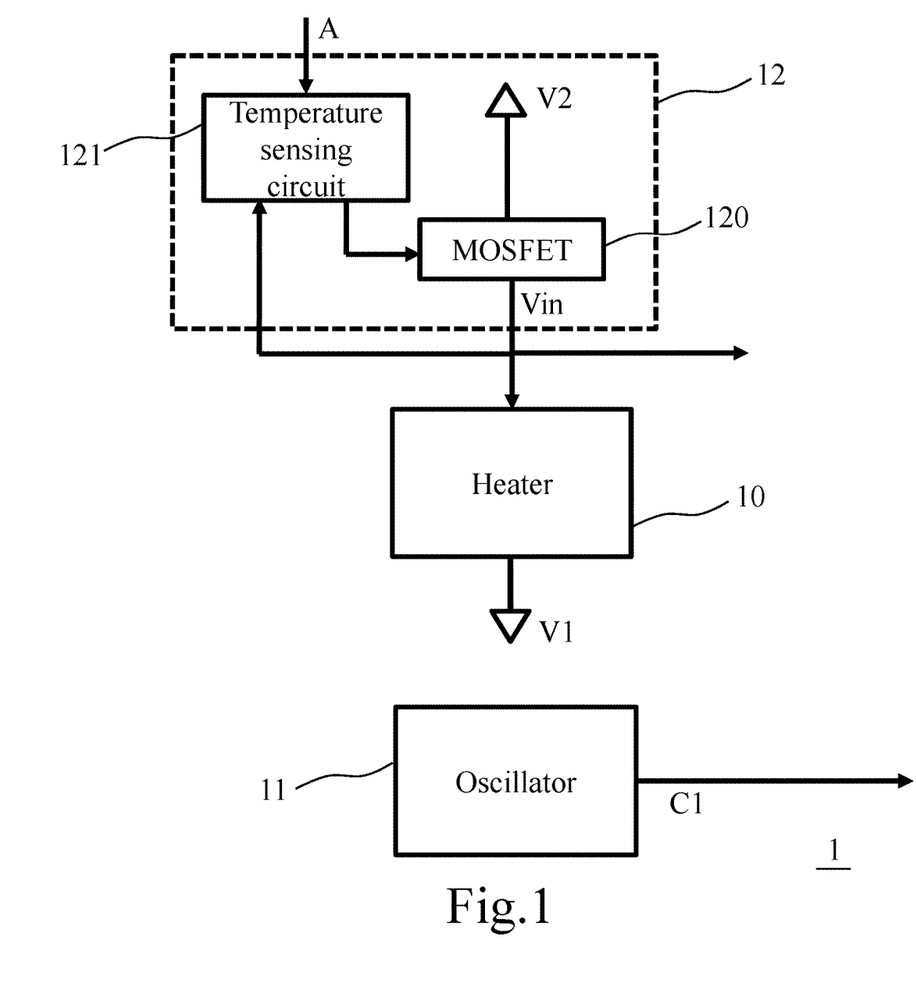
FIG. 1 is a schematic diagram illustrating an oscillating device according to a first embodiment of the present invention.
Figure 2:
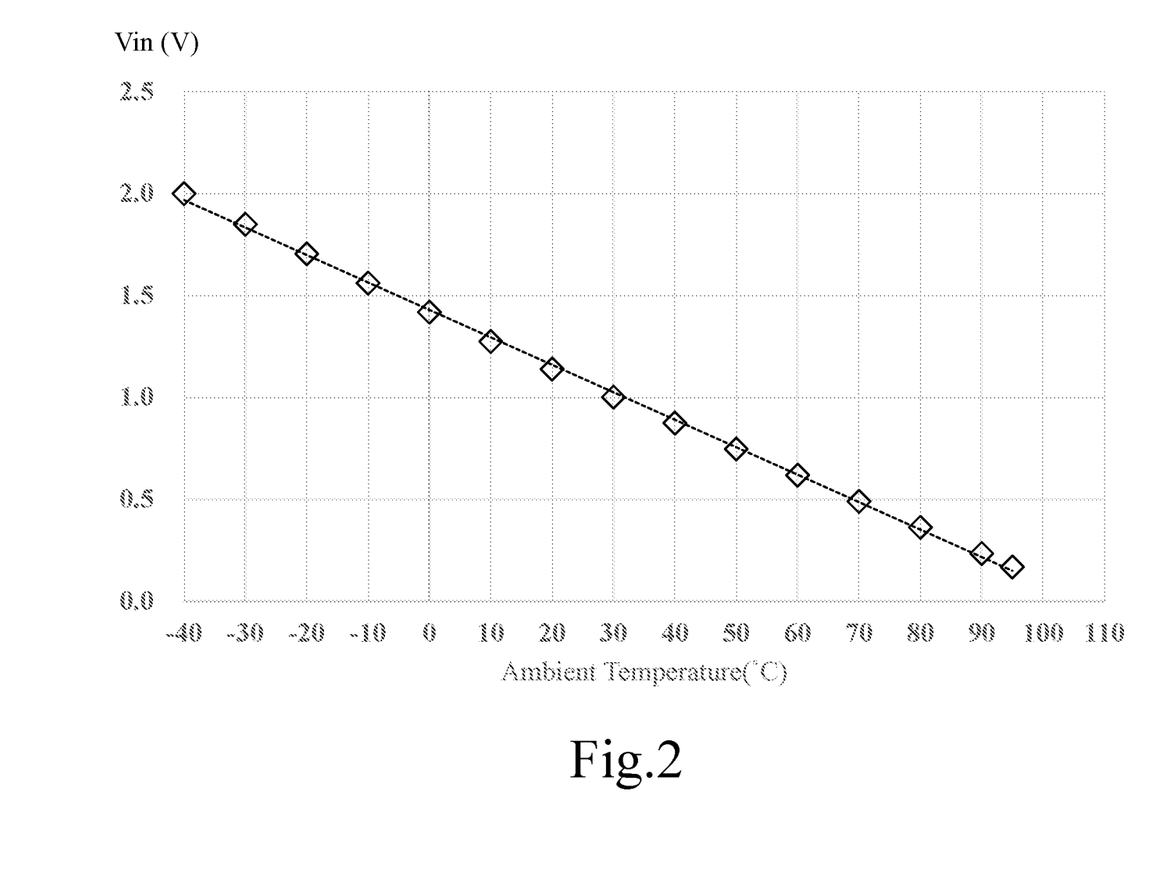
FIG. 2 is a schematic diagram illustrating an input voltage versus ambient temperature curve of an oscillating device according to an embodiment of the present invention.

FIG. 1 is a schematic diagram illustrating an oscillating device according to a first embodiment of the present invention. FIG. 2 is a schematic diagram illustrating an input voltage versus ambient temperature curve of an oscillating device according to an embodiment of the present invention. Referring to FIG. 1, an oscillating device 1 will be introduced as follows. The oscillating device 1 arranged in an environment having an ambient temperature A, includes a heater 10, an oscillator 11, and a temperature-controlled circuit 12. The temperature-controlled circuit 12 is directly electrically connected to the heater 10. The oscillator generates a first clock signal C1 whose frequency is temperature-dependent on the ambient temperature. The temperature-controlled circuit 12 senses the ambient temperature A to generate an input voltage Vin that is temperature-dependent on the ambient temperature and provides the input voltage Vin for the heater 10 to reduce the frequency variation of the first clock signal C1 resulted from the variation of ambient temperature.

The primary objective of temperature post-compensation is to establish the correlation between frequency and ambient temperature. However, relying solely on ambient temperature cannot adequately characterize the state of the oscillating device 1 as it undergoes a thermodynamic process. Even when the ambient temperature eventually stabilizes, the oscillating device 1 remains in a non-equilibrium thermal state. To capture the transient state of the oscillating device 1, the input voltage Vin as a physical quantity is essential. Instead of measuring the temperature directly from the oscillator 11, which offers insufficient resolution within a few degrees Celsius, the input voltage Vin can be measured. The input voltage Vin is associated with the control voltage managed by the temperature-controlled circuit 12. The voltage swing during ambient temperature fluctuations from −40° C. to 95° C. can span from 0 to 2 volts, as illustrated in FIG. 2. Consequently, a parameter is derived from the input voltage Vin. By measuring this parameter, along with frequency and ambient temperature, temperature post-compensation can be dynamically or statically completed.

The temperature-controlled circuit 12 includes a metal-oxide-semiconductor field-effect transistor (MOSFET) 120 and a temperature sensing circuit 121. The drain of the MOSFET 120 is directly electrically connected to the heater 10. The MOSFET 120 and the heater 10 are electrically connected between a first voltage terminal having a first voltage V1 and a second voltage terminal having a second voltage V2. The temperature sensing circuit 121 is electrically connected to the gate and the drain of the MOSFET 120 and the heater 10. When the MOSFET 120 is a P-channel metal-oxide-semiconductor field effect transistor (PMOSFET), the source of the PMOSFET and the heater 10 are respectively electrically connected to a high voltage terminal as the second voltage terminal and a low voltage terminal as the first voltage terminal. When the MOSFET 120 is an N-channel metal-oxide-semiconductor field effect transistor (NMOSFET), the source of the NMOSFET and the heater 10 are respectively electrically connected to a low voltage terminal as the second voltage terminal and a high voltage terminal as the first voltage terminal. The temperature sensing circuit 121 senses the ambient temperature and receives the input voltage Vin to adjust the gate voltage of the MOSFET 120 based on the ambient temperature and the input voltage Vin. Driven by the temperature sensing circuit 121, the MOSFET 120 receive the second voltage V2 to generate the input voltage Vin.

Figure 3:
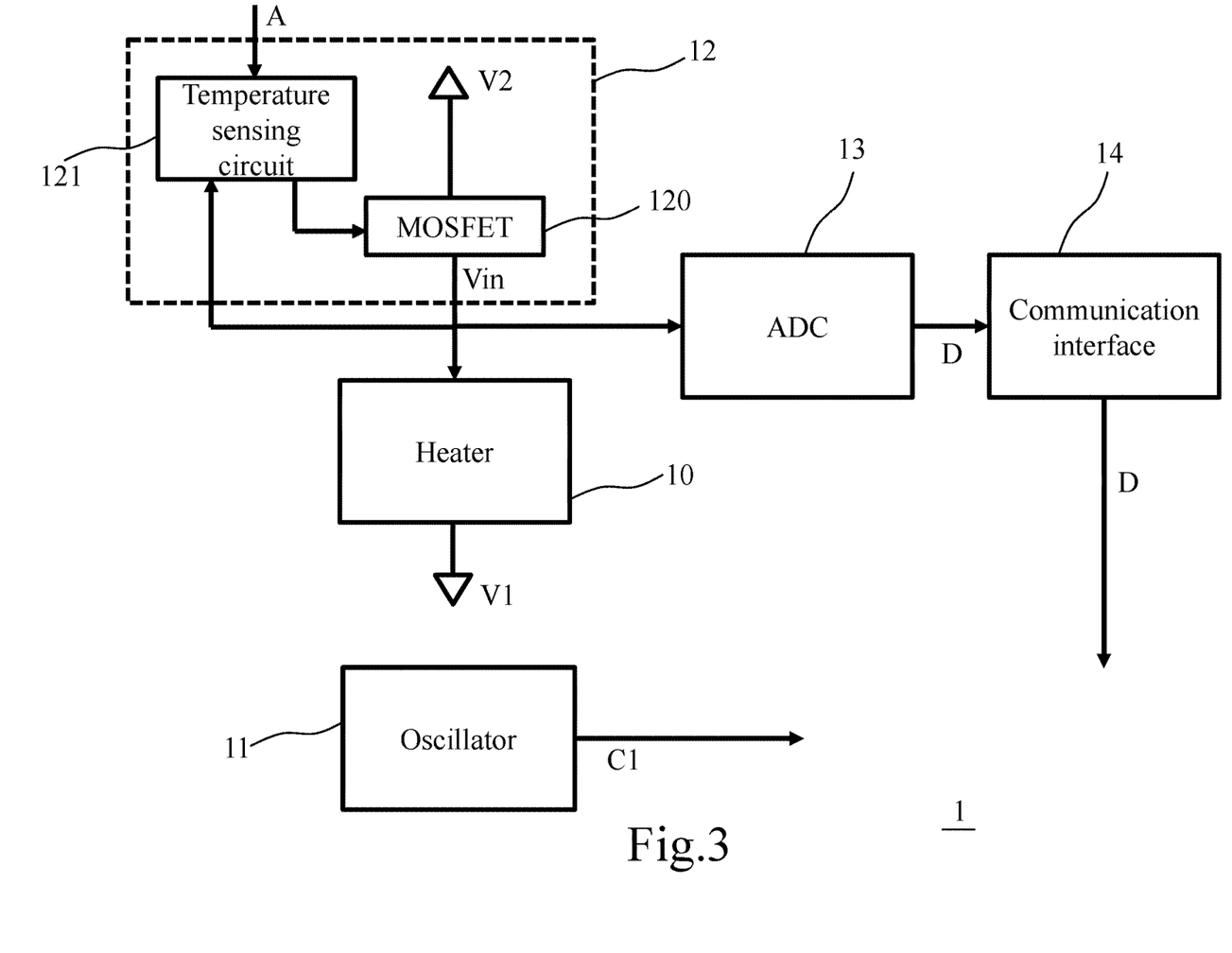
FIG. 3 is a schematic diagram illustrating an oscillating device according to a second embodiment of the present invention.

FIG. 3 is a schematic diagram illustrating an oscillating device according to a second embodiment of the present invention. Referring to FIG. 3, the second embodiment is different from the first embodiment in that the second embodiment of the oscillating device 1 further includes an analog-to-digital converter (ADC) 13 and a communication interface 14.

Figure 4:
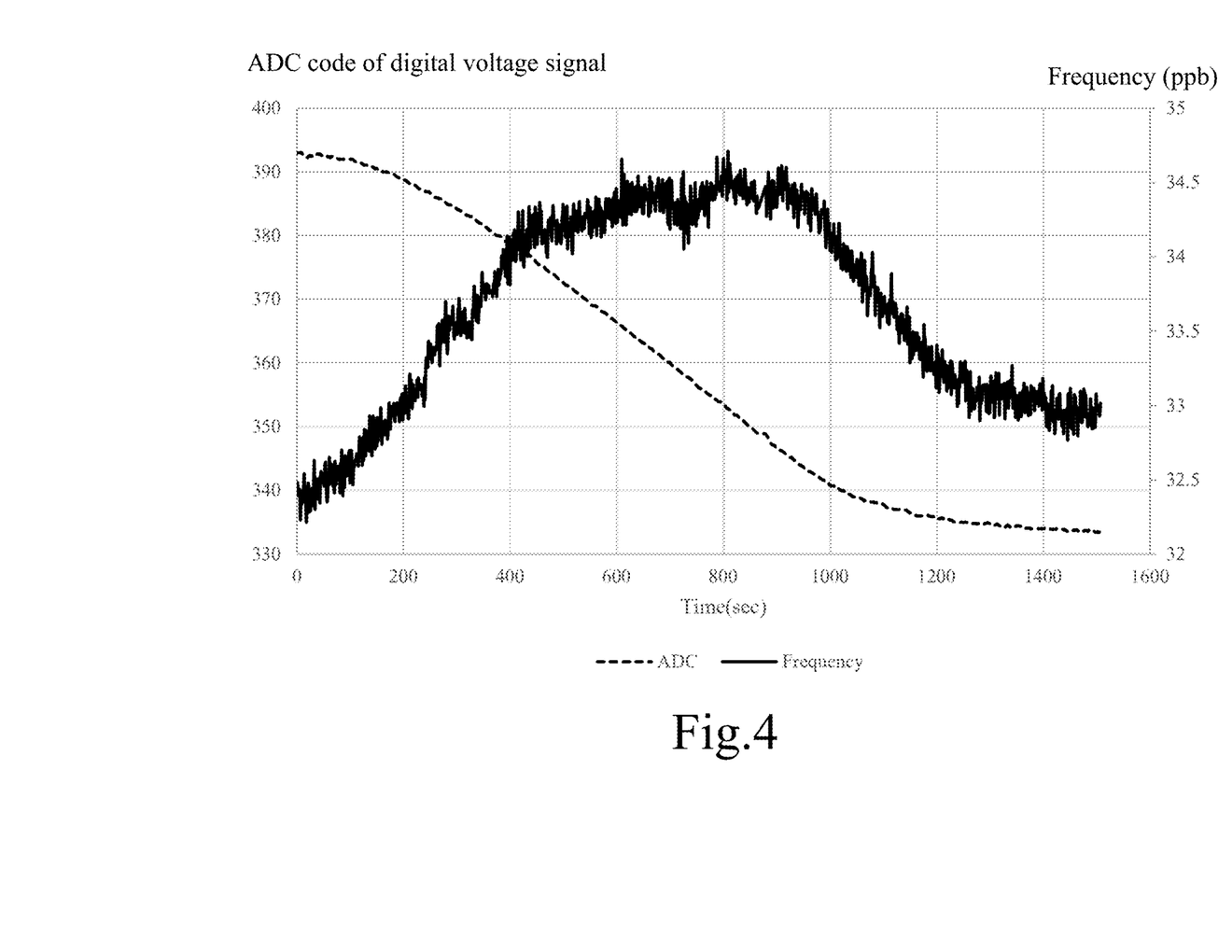
FIG. 4 is a schematic diagram illustrating a digital voltage signal versus time curve and a first clock signal versus time curve of an oscillating device according to an embodiment of the present invention.
Figure 5:
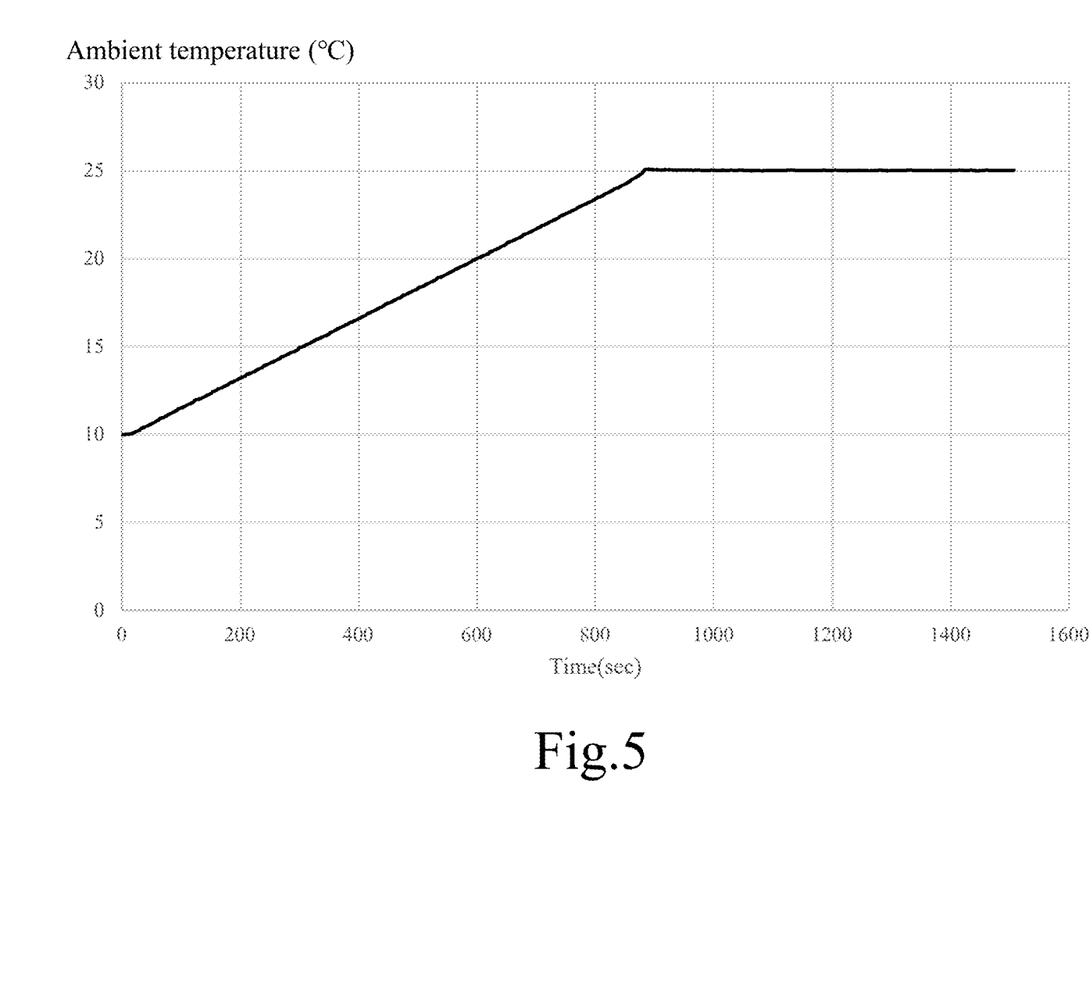
FIG. 5 is a schematic diagram illustrating an ambient temperature versus time curve of the present invention.

The communication interface 14 may be, but not limited to, an inter-integrated circuit (I$_2$C) bus or a serial peripheral interface (SPI) bus. The ADC 13 is electrically connected to the heater 10 and the temperature-controlled circuit 12. The communication interface 14 is electrically connected to the ADC 13. The ADC 13 receives and converts the input voltage Vin into a digital voltage signal D that complies with the communication protocol of the communication interface 14 and outputs the digital voltage signal D through the communication interface 14. The other components of the embodiment of FIG. 3 have been described previously so it will not be reiterated. FIG. 4 is a schematic diagram illustrating a digital voltage signal versus time curve and a first clock signal versus time curve of an oscillating device according to an embodiment of the present invention. FIG. 5 is a schematic diagram illustrating an ambient temperature versus time curve of the present invention. As illustrated in FIGS. 4-5, when the ambient temperature stabilizes at 25° C., both frequency and the digital voltage signal D continue to change. This observation indicates that the input voltage Vin can serve as a parameter for detecting whether the oscillating device is in thermal equilibrium with the ambient temperature without measuring power consumption.

Figure 6:
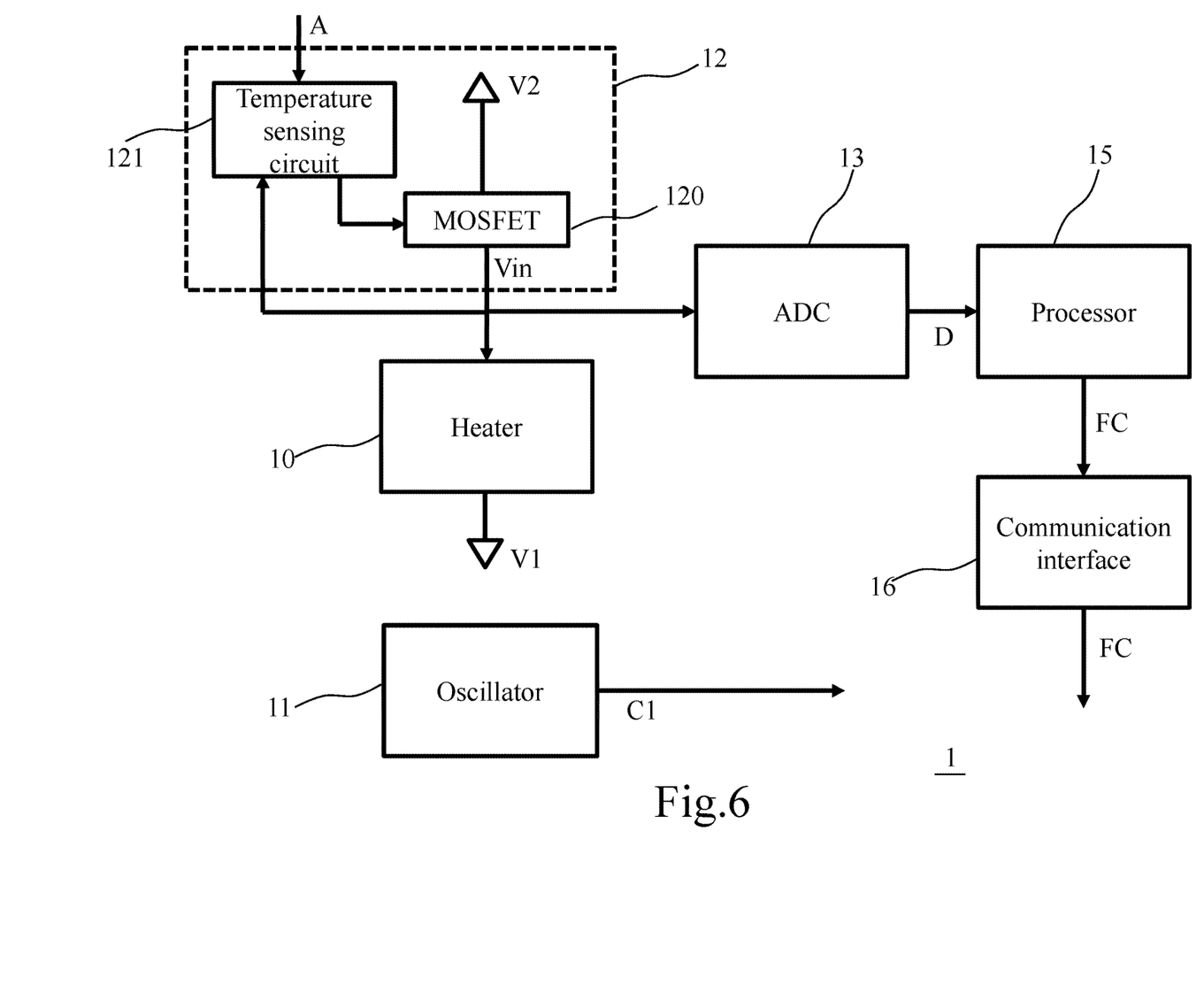
FIG. 6 is a schematic diagram illustrating an oscillating device according to a third embodiment of the present invention.

FIG. 6 is a schematic diagram illustrating an oscillating device according to a third embodiment of the present invention. Referring to FIG. 6, the third embodiment is different from the first embodiment in that the third embodiment of the oscillating device 1 further includes an analog-to-digital converter (ADC) 13, a processor 15, and a communication interface 16. The communication interface 16 may be, but not limited to, an inter-integrated circuit (I$_2$C) bus or a serial peripheral interface (SPI) bus. The ADC 13 is electrically connected to the heater 10 and the temperature-controlled circuit 12. The processor 15 is electrically connected to the ADC 13. The communication interface 16 is electrically connected to the processor 15. The ADC 13 receives and converts the input voltage Vin into a digital voltage signal D. The processor 15 receives the digital voltage signal D and converts the digital voltage signal D into a frequency compensation signal FC that complies with the communication protocol of the communication interface 16 based on a voltage-frequency relationship associated with the input voltage Vin. In some embodiments, the voltage-frequency relationship is associated with the time varying rate of the digital voltage signal D. For example, the voltage-frequency relationship is associated with a linear combination of polynomials to the digital voltage signal D. The processor 15 outputs the digital voltage signal D through the communication interface 16. The other components of the embodiment of FIG. 6 have been described previously so it will not be reiterated.

Figure 7:
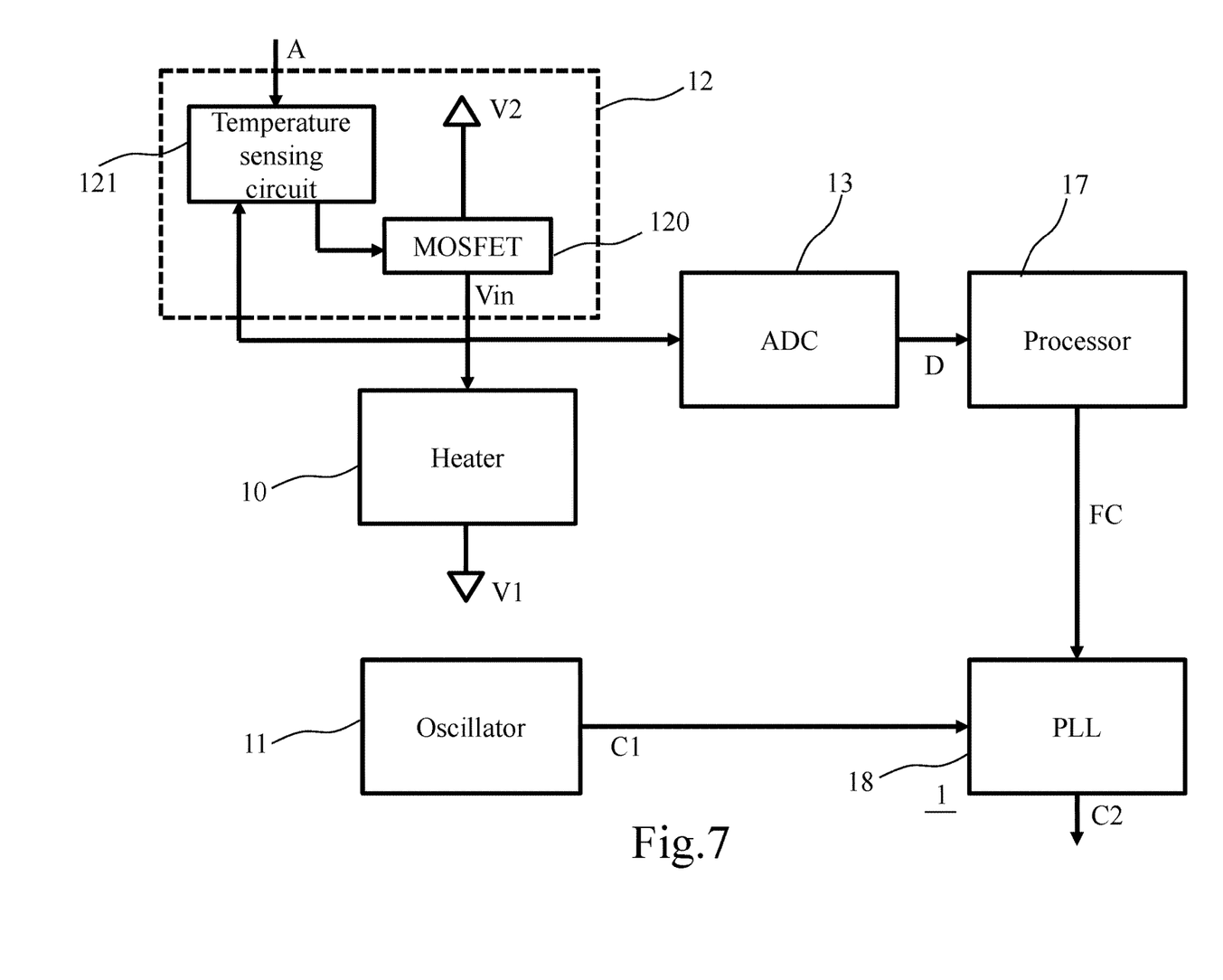
FIG. 7 is a schematic diagram illustrating an oscillating device according to a fourth embodiment of the present invention.

FIG. 7 is a schematic diagram illustrating an oscillating device according to a fourth embodiment of the present invention. Referring to FIG. 7, the fourth embodiment is different from the first embodiment in that the fourth embodiment of the oscillating device 1 further includes an analog-to-digital converter (ADC) 13, a processor 17, and a phase-locked loop (PLL) 18. The ADC 13 is electrically connected to the heater 10 and the temperature-controlled circuit 12. The processor 17 is electrically connected to the ADC 13. The PLL 18 is electrically connected to the processor 17 and the oscillator 11. The ADC 13 receives and converts the input voltage Vin into a digital voltage signal D. The processor 17 receives the digital voltage signal D. The processor 17 converts the digital voltage signal D into a frequency compensation signal FC based on a voltage-frequency relationship associated with the input voltage Vin. In some embodiments, the voltage-frequency relationship is associated with the time varying rate of the digital voltage signal D. For example, the voltage-frequency relationship is associated with a linear combination of polynomials to the digital voltage signal D. The PLL 18 receives the frequency compensation signal FC and the first clock signal C1 and changes the phase of the first clock signal C1 based on the frequency compensation signal FC to generate a second clock signal C2 whose frequency is closer to a reference frequency than the frequency of the first clock signal C1. The reference frequency is a standard frequency. For example, the standard frequency may come from a global positioning system (GPS). The other components of the embodiment of FIG. 7 have been described previously so it will not be reiterated.

According to the embodiments provided above, the oscillating device provides the input voltage for the heater to reduce the frequency variation of the first clock signal resulted from the variation of ambient temperature and uses the input voltage as a physical quantity to capture the transient state of the oscillating device, thereby completing temperature post-compensation.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. An oscillating device, arranged in an environment having an ambient temperature, comprising:
    a heater;
    an oscillator is configured to generate a first clock signal whose frequency is temperature-dependent on the ambient temperature; and
    a temperature-controlled circuit directly electrically connected to the heater, wherein the temperature-controlled circuit is configured to sense the ambient temperature to generate an input voltage that is temperature-dependent on the ambient temperature and provide the input voltage for the heater;
    wherein the temperature-controlled circuit comprises:
    a metal-oxide-semiconductor field-effect transistor (MOSFET) with a drain thereof directly electrically connected to the heater, wherein the MOSFET and the heater are electrically connected between a high voltage terminal and a low voltage terminal, and the MOSFET is configured to generate the input voltage; and
    a temperature sensing circuit electrically connected to a gate and the drain of the MOSFET and the heater and configured to sense the ambient temperature, receive the input voltage, and adjust a gate voltage of the MOSFET based on the ambient temperature and the input voltage.

2. The oscillating device according to claim 1, further comprising:
    an analog-to-digital converter (ADC) electrically connected to the heater and the temperature-controlled circuit and configured to receive and convert the input voltage into a digital voltage signal; and
    a communication interface electrically connected to the ADC.

3. The oscillating device according to claim 1, further comprising:
    an analog-to-digital converter (ADC) electrically connected to the heater and the temperature-controlled circuit and configured to receive and convert the input voltage into a digital voltage signal;
    a processor electrically connected to the ADC and configured to receive the digital voltage signal, wherein the processor is configured to convert the digital voltage signal into a frequency compensation signal based on a voltage-frequency relationship associated with the input voltage; and
    a communication interface electrically connected to the processor.

4. The oscillating device according to claim 1, further comprising:
    an analog-to-digital converter (ADC) electrically connected to the heater and the temperature-controlled circuit and configured to receive and convert the input voltage into a digital voltage signal;
    a processor electrically connected to the ADC and configured to receive the digital voltage signal, wherein the processor is configured to convert the digital voltage signal into a frequency compensation signal based on a voltage-frequency relationship associated with the input voltage; and
    a phase-locked loop (PLL) electrically connected to the processor and the oscillator and configured to receive the frequency compensation signal and the first clock signal, wherein the PLL is configured to change the phase of the first clock signal based on the frequency compensation signal to generate a second clock signal.

5. The oscillating device according to claim 4, wherein the voltage-frequency relationship is associated with a time varying rate of the digital voltage signal.

6. The oscillating device according to claim 4, wherein the voltage-frequency relationship is associated with a linear combination of polynomials to the digital voltage signal.

7. The oscillating device according to claim 1, wherein the MOSFET is a P-channel metal-oxide-semiconductor field effect transistor (PMOSFET) and a source of the PMOSFET and the heater are respectively electrically connected to the high voltage terminal and the low voltage terminal.

8. The oscillating device according to claim 1, wherein the MOSFET is an N-channel metal-oxide-semiconductor field effect transistor (NMOSFET) and a source of the NMOSFET and the heater are respectively electrically connected to the low voltage terminal and the high voltage terminal.

* * * * *